United States Patent
Hwang et al.

(10) Patent No.: US 8,053,978 B2
(45) Date of Patent: Nov. 8, 2011

(54) ORGANIC LIGHT EMITTING DIODE DISPLAYS WITH TRANSFLECTIVE MEMBERS

(75) Inventors: Young-In Hwang, Yongin-si (KR); Baek-Woon Lee, Yongin-si (KR); Hae-Yeon Lee, Bucheon-si (KR)

(73) Assignee: Samsung Electronics Co., Ltd. (KR)

( * ) Notice: Subject to any disclaimer, the term of this patent is extended or adjusted under 35 U.S.C. 154(b) by 262 days.

(21) Appl. No.: 12/363,351

(22) Filed: Jan. 30, 2009

(65) Prior Publication Data

US 2010/0072883 A1    Mar. 25, 2010

(30) Foreign Application Priority Data

Sep. 22, 2008   (KR) .................. 10-2008-0092765

(51) Int. Cl.
*H01L 51/50* (2006.01)
(52) U.S. Cl. ........................................ 313/504
(58) Field of Classification Search ............... 313/504, 313/512
See application file for complete search history.

(56) References Cited

U.S. PATENT DOCUMENTS

| | | | | |
|---|---|---|---|---|
| 2006/0244370 A1* | 11/2006 | Tyan et al. | .................... | 313/506 |
| 2006/0250079 A1 | 11/2006 | Kwok | | |
| 2007/0001588 A1 | 1/2007 | Boroson | | |

FOREIGN PATENT DOCUMENTS

| | | |
|---|---|---|
| JP | 2003-123987 | 4/2003 |
| JP | 2004-127588 | 4/2004 |
| JP | 2006-302506 | 11/2006 |
| JP | 2006-324016 | 11/2006 |
| JP | 2007-329054 | 12/2007 |
| KR | 100704580 | 4/2007 |
| KR | 100752321 | 8/2007 |
| KR | 1020080018557 | 2/2008 |

OTHER PUBLICATIONS

English Abstract for JP Pat. Pub. No. 2003-123987, 1 page.
English Abstract for KR Pat. Pub. No. 100752321, 2 pages.
English Abstract for KR Pat. Pub. No. 100704580, 2 pages.
English Abstract for JP Pat. Pub. No. 2007-329054, 1 page.
English Abstract for JP Pat. Pub. No. 2006-302506, 1 page.
English Abstract for KR Pat. Pub. No. 1020080018557, 1 page.
English Abstract for JP Pat. Pub. No. 2006-324016, 1 page.
English Abstract for JP Pat. Pub. No. 2004-127588, 1 page.
Lu, Yin-Jui et al., "Achieving Three-Peak White Organic Light-Emitting Devices Using Wavelength-Selective Mirror Electrodes" 2008 American Institute of Physics, Applied Physics Letters 92, 2008, 3 pages, vol. 92, pp. 123303-1-123303-3.

* cited by examiner

*Primary Examiner* — Toan Ton
*Assistant Examiner* — Hana Featherly
(74) *Attorney, Agent, or Firm* — Innovation Counsel LLP

(57) ABSTRACT

An organic light emitting device comprises: one or more first transflective members disposed on the substrate; one or more pixel electrodes disposed on the respective one or more first transflective members; one or more first organic light emitting members disposed on the respective one or more pixel electrodes; one or more second transflective members disposed on the respective one or more first organic light emitting members; one or more second organic light emitting members disposed on the respective second transflective members; and a common electrode disposed on the one or more second organic light emitting members. Other embodiments are also provided.

27 Claims, 7 Drawing Sheets

ORGANIC LIGHT EMITTING DIODE DISPLAYS WITH TRANSFLECTIVE MEMBERS

CROSS-REFERENCE TO RELATED APPLICATION

This application claims priority to and the benefit of Korean Patent Application No. 10-2008-0092765 filed in the Korean Intellectual Property Office on Sep. 22, 2008, the entire contents of which are incorporated herein by reference.

BACKGROUND OF THE INVENTION (a) Field of the Invention

The present invention relates to an organic light emitting device.

(b) Description of the Related Art

Because an organic light emitting device is self-emissive, it does not require a separate light source, and therefore lower power consumption is achievable. In addition, organic light emitting devices can provide a high response speed, a wide viewing angle, and high contrast ratio.

An organic light emitting device includes a plurality of pixels, and may include red, blue, and green pixels to display color images by mixing red, blue and green light.

Each pixel of an organic light emitting device includes an organic light emitting element. The organic light emitting elements are driven by thin film transistors.

An organic light emitting element includes an anode, a cathode, and an organic light emitting member disposed therebetween. Each organic light emitting member emits light of a respective one of three primary colors such as red, green, and blue, or alternatively emits white light. The organic light emitting member is made of materials suitable for emitting the desired color. If white light is desired, the organic light emitting member can be made of a stack of red, blue and green emitting materials which together provide white light. Of note, a non-white pixel can be obtained by using a white organic light emitting member with a color filter.

The above information disclosed in this Background section is only for enhancement of understanding of the background of the invention and may therefore contain information that is not prior art with respect to the present application.

SUMMARY

This section summarizes some features of the present disclosure of invention. Other features are described in the subsequent sections. The present disclosure of invention includes subject matter disclosed in the appended claims which subject matter is thus incorporated into this section by reference.

Some embodiments provide an organic light emitting device comprising: a substrate; one or more first transflective members disposed on the substrate; one or more pixel electrodes disposed on the respective one or more first transflective members; one or more first organic light emitting members disposed on the respective one or more pixel electrodes; one or more second transflective members disposed on the respective one or more first organic light emitting members; one or more second organic light emitting members disposed on the respective second transflective members; and a common electrode disposed on the one or more second organic light emitting members.

Some embodiments provide an organic light emitting device comprising a pfirst pixel displaying a first color, a second pixel displaying a second color, and a third pixel displaying a third color, wherein each of the first, second and third pixels comprises: a first transflective member; a pixel electrode disposed on the first transflective member; a first organic light emitting member disposed on the pixel electrode; a second transflective member disposed on the first organic light emitting member; a second organic light emitting member disposed on the second transflective member; and a common electrode disposed on the second organic light emitting member.

Some embodiments provide an organic light emitting device comprising: a first pixel displaying a first color, a second pixel displaying a second color, a third pixel displaying a third color, and a white pixel for displaying a white color, wherein each of the first, second, third, and white pixels comprises a first transflective member; a pixel electrode disposed on the first transflective member; a first organic light emitting member disposed on the pixel electrode; a second transflective member disposed on the first organic light emitting member; a second organic light emitting member disposed on the second transflective member; and a common electrode disposed on the second organic light emitting member.

Some embodiments provide an organic light emitting device comprising: a substrate; a reflective electrode disposed on the substrate; a first organic light emitting member disposed on the reflective electrode; a transflective member disposed on the first organic light emitting member; a second organic light emitting member disposed on the transflective member; and a common electrode disposed on the second organic light emitting member and at least partially transmissive to light.

Figure 1:
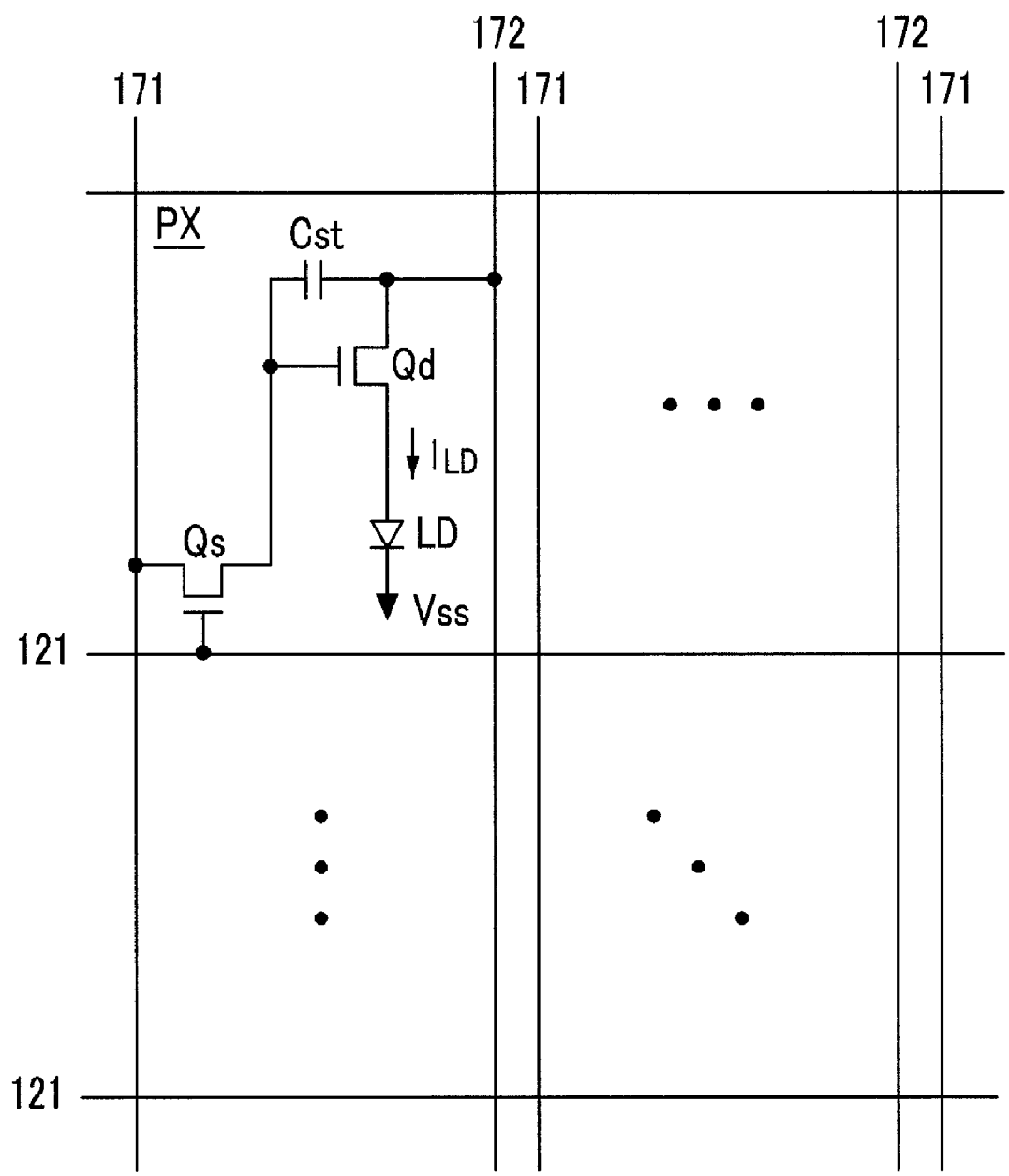
FIG. 1 is a circuit diagram of an organic light emitting device in accordance with an exemplary embodiment of the present invention.

<Description of Some Reference Numerals Used in the Drawings>

| | |
|---|---|
| 110: insulation substrate | 112: insulating layer |
| 121: gate line | 171: data line |
| 172: driving voltage line | 180: overcoat |
| 191R, 191G, 191B, 191W: pixel electrodes | |
| 194R, 194G, 194B, 194W: lower transflective members | |
| 198R, 198G, 198B, 198W: upper transflective members | |
| 230R, 230G, 230B: color filters | |
| 270: common electrode | 361: insulating members |
| 380, 390: organic light emitting members | 391: partitions |
| Cst: storage capacitor | $I_{LD}$: driving current |
| LD: organic light emitting element | PX, R, G, B, W: pixels |
| Qs: switching transistor | |
| Qd: driving transistor | |

DETAILED DESCRIPTION OF THE EMBODIMENTS

Some embodiments of the present disclosure of invention will now be described with reference to the accompanying drawings. These embodiments do not limit the invention.

In the drawings, dimensions can be exaggerated or otherwise changed for clarity. Like reference numerals designate like elements. It will be understood that when an element is referred to as being "on" another element, then intervening elements may or may not be present. In contrast, when an element is referred to as being "directly on" another element, there are no intervening elements present.

FIG. 1 is a circuit diagram of an organic light emitting device in accordance with some exemplary embodiments of the present invention. This organic light emitting device includes a plurality of signal lines 121, 171, and 172, and a plurality of pixels PX connected to the signal lines 121, 171, and 172 and arranged in a grid. The organic light emitting device may include an array of pixel groups, each group including a red pixel, a green pixel, a blue pixel, and possibly a white pixel W.

The signal lines 121 are gate lines which transmit gate signals (or scanning signals). The signal lines 171 are data lines which transmit data signals. The signal lines 172 are driving voltage lines which transmit driving voltages. The gate lines 121 extend substantially in a row direction and are substantially parallel to each other, and the data lines 171 extend substantially in a column direction and are substantially parallel to each other. Although the driving voltage lines 172 are shown as extending substantially in the column direction, the driving voltage lines 172 may extend in the row direction or may be arranged in a matrix.

Each pixel PX includes a switching transistor Qs, a driving transistor Qd, a storage capacitor Cst, and an organic light emitting element LD.

The switching transistor Qs includes a control terminal, an input terminal, and an output terminal. The control terminal is connected to the gate line 121, the input terminal is connected to the data line 171, and the output terminal is connected to the driving transistor Qd. The switching transistor Qs transmits a data signal from the data line 171 to the driving transistor Qd in response to a scanning signal on the gate line 121.

The driving transistor Qd also includes a control terminal, an input terminal, and an output terminal. The control terminal is connected to the switching transistor Qs, the input terminal is connected to the driving voltage line 172, and the output terminal is connected to the organic light emitting element LD. The driving transistor Qd provides an output current $I_{LD}$, whose magnitude depends on the voltage between the control terminal and the output terminal.

The capacitor Cst is connected between the control terminal and the input terminal of the driving transistor Qd. The capacitor Cst stores the data signal applied to the control terminal of the driving transistor Qd to maintain the data signal even after the switching transistor Qs is turned off.

The organic light emitting element LD is an organic light emitting diode (OLED). In one example, the organic light emitting element LD has its anode connected to the output terminal of the driving transistor Qd and has its cathode connected to a common voltage Vss. The organic light emitting element LD emits light whose intensity is controlled by the output current $I_{LD}$ of the driving transistor Qd to display a desired image.

The switching transistor Qs and the driving transistor Qd are n-channel field effect transistors (FET); however, at least one of the switching transistor Qs and the driving transistor Qd may be a p-channel FET. Further, the transistors Qs and Qd, the storage capacitor Cst, and the organic light emitting element LD may be interconnected in a number of configurations.

Figure 2:
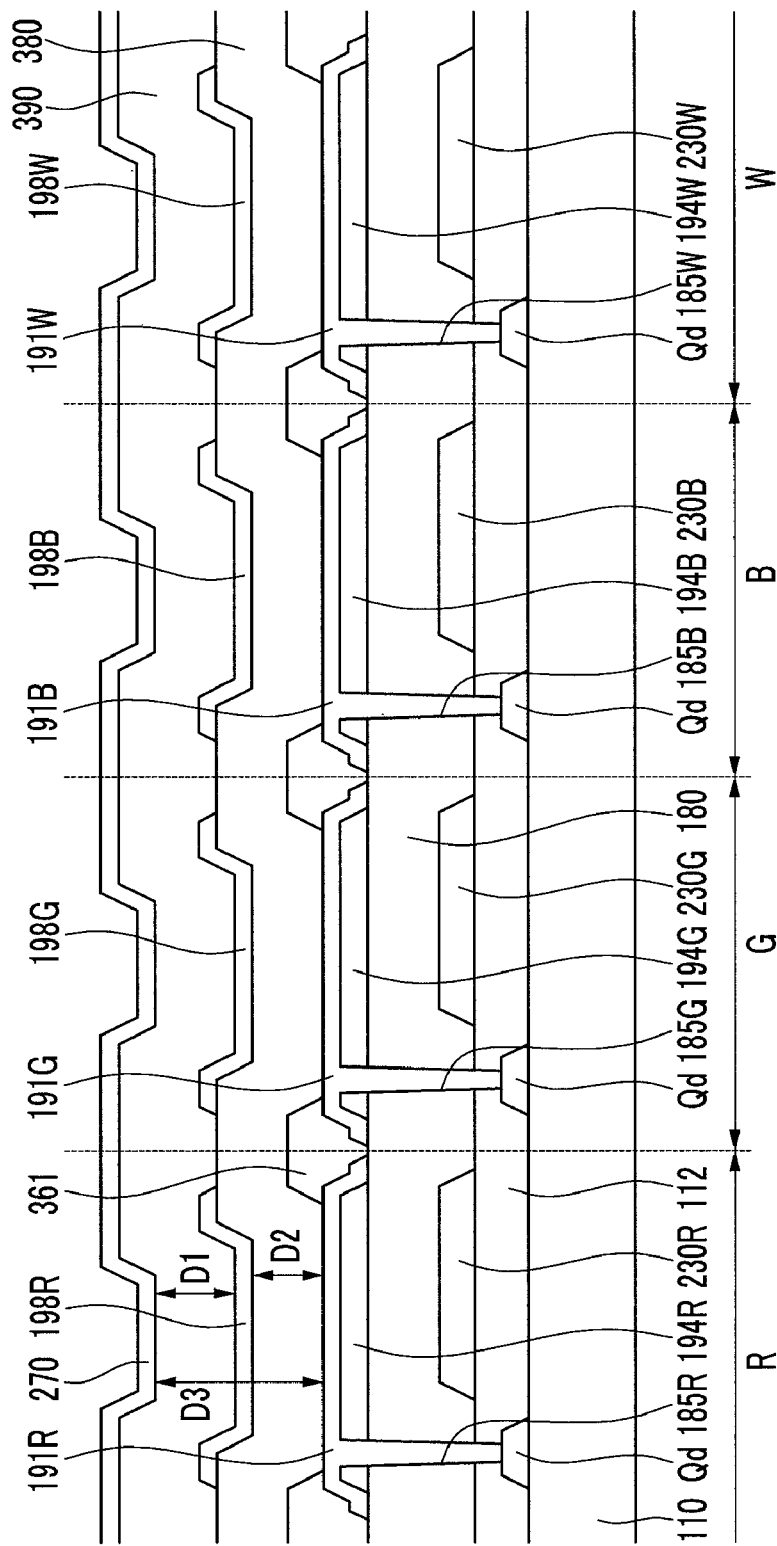
FIG. 2 is a cross-sectional view of an organic light emitting device in accordance with an exemplary embodiment of the present invention.
Figure 3:
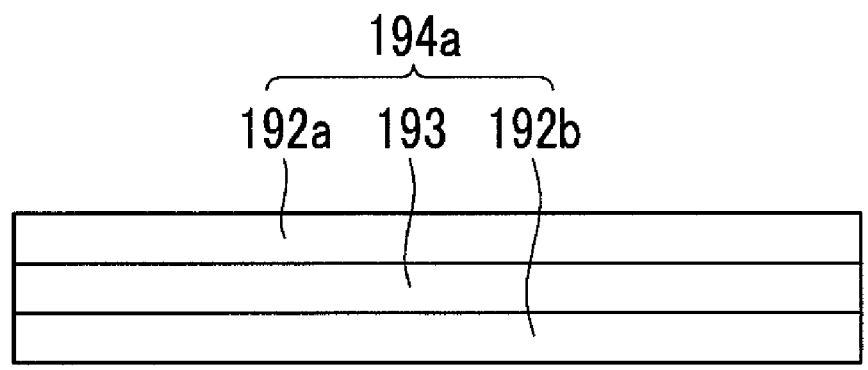
FIG. 3 and FIG. 4 are cross-sectional views of transflective members in organic light emitting devices according to exemplary embodiments of the present invention.
Figure 4:
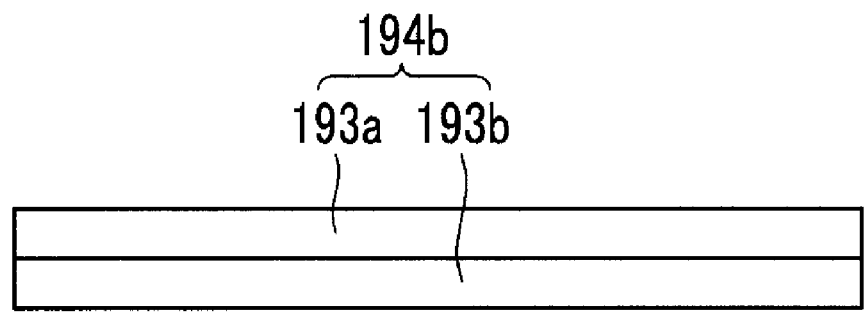

FIGS. 2 to 4 illustrate some structural details of the organic light emitting device shown in FIG. 1. FIG. 2 is a cross-sectional view of the organic light emitting device, and FIG. 3 and FIG. 4 are cross-sectional views showing transflective members that can be used in the organic light emitting device.

In the organic light emitting device, a thin film transistor array with the switching transistors Qs (not shown) and the driving transistors Qd is formed on an insulation substrate 110 that may be made of transparent glass or plastic. The switching and driving transistors are described above and will not be described any further.

An insulating layer 112 is disposed on the thin film transistor array.

On the insulating layer 112, a red color filter 230R is provided at the location of each red pixel R; a green color filter 230G is provided at the location of each green pixel G, a blue color filter 230B is provided at the location of each blue pixel B, and a transparent white color filter 230W is provided at the location of each white pixel W. The white color filters 230W of the white pixels W may be omitted.

An overcoat 180 is disposed over the color filters 230R, 230G, 230B, and 230W and the insulating layer 112. The overcoat 180 may be made of an organic material and have a flat upper surface.

Lower transflective members 194R, 194G, 194B, and 194W are disposed at the locations of the respective pixels R, G, B, and W on the overcoat 180. Each of the lower transflective members 194R, 194G, 194B, and 194W may simultaneously partially reflect and partially transmit incident light.

Contact holes 185R, 185G, 185B, and 185W are formed in the insulating layer 112, the overcoat 180, and the respective transflective members 194R, 194G, 194B, and 194W to the output terminals of the respective driving transistors Qd.

Pixel electrodes 191R, 191B, 191G, and 191W, possibly made of a transparent conductive material such as indium tin oxide (ITO) or indium zinc oxide (IZO), are disposed over, and in physical contact with, the respective lower transflective members 194R, 194G, 194B, and 194W. The pixel electrodes 191R, 191G, 191B, and 191W are connected to the driving transistors Qd through the respective contact holes 185R, 185G, 185B, and 185W. Alternatively, if the lower transflective members 194R, 194G, 194B, and 194W are made of a conductive material, then they can electrically contact the driving transistors Qd through suitable contact holes (not shown) in the insulating layer 112 and the overcoat 180, and can serve as interconnects between the driving transistors Qd and the pixel electrodes, or can serve as pixel electrodes themselves so that the separate electrodes 191R, 191G, 191B, 191W can be omitted.

Insulating members 361 are disposed between the neighboring pixel electrodes 191R, 191G, 191B, and 191W to insulate the neighboring pixel electrodes from each other. The insulating members 361 may be omitted.

A lower organic light emitting member 380 is disposed on the insulating members 361 and the pixel electrodes 191R, 191G, 191B, and 191W. Each pixel R, G, B, W includes a portion of the lower organic light emitting member 380 over the corresponding pixel electrode 191R, 191G, 191B, or 191W, and the term "lower organic light emitting member 380" will be used both for the whole layer 380 and for each individual portion in a pixel. Thus, the lower organic members 380 of the individual pixels are part of a continuous lower organic member 380 extending over multiple pixel electrodes.

Upper transflective members 198R, 198G, 198B, and 198W are disposed at the locations of the respective pixels R, G, B, and W on the lower organic light emitting member 380. Each of the upper transflective members 198R, 198G, 198B, and 198W may simultaneously partially reflect and partially transmit incident light.

If the upper transflective members 198R, 198G, 198B, and 198W are made of a conductive material, the may be spaced from each other so that the pixels would be insulated from each other. In this case, the upper transflective members 198R, 198G, 198B, and 198W may be formed using a shadow mask.

An upper organic light emitting member 390 is disposed on the upper transflective members 198R, 198G, 198B, and 198W. Each pixel R, G, B, W includes a portion of the upper organic light emitting member 390 over the corresponding upper transflective member 198R, 198G, 198B, or 198W, and the term "upper organic light emitting member 390" will be used both for the whole layer 390 and for each individual portion. Thus, the upper organic members 390 of the individual pixels are part of a continuous upper organic member 390 extending over multiple pixel electrodes.

The lower and upper organic light emitting members 380 and 390 may be white organic light emitting members, and any one or both of them may each be a stack of organic materials emitting different primary colors which together form white light. Alternatively, a separate pair of light emitting members 380, 390 can be provided for each pixel R, G, B, W to emit respectively red, green, blue, or white light. In this case, the red, green, and blue color filters 230R, 230G, 230B can be omitted. The white color filters 230W can also be omitted. Further, some embodiments include additional organic light emitting members, formed from additional layers, besides the lower and upper organic light emitting members 380 and 390.

A common electrode 270 receiving a common voltage Vss is disposed on the upper organic light emitting member 390. The common electrode 270 may be made of a reflective metal such as calcium (Ca), barium (Ba), magnesium (Mg), aluminum (Al), or silver (Ag).

In each pixel of such an organic light emitting device, the corresponding pixel electrode 191R, 191G, 191B, or 191W, the corresponding lower and upper organic light emitting members 380 and 390 in that pixel, and the common electrode 270 form an organic light emitting element LD in which the pixel electrode serves as the anode while the common electrode 270 serves as the cathode.

When displaying an image, the organic light emitting device emits light downward, i.e. towards the substrate 110.

Light emitted upward from the upper organic light emitting member 390 toward the common electrode 270, and light emitted upward from the lower organic light emitting member 380 and transmitted through the upper transflective members 198R, 198G, 198B, 198W, is reflected by the common electrode 270 and arrives at the upper transflective members 198R, 198G, 198B, 198W. This light is then partially reflected toward the common electrode 270 by the upper transflective members 198R, 198G, 198B, and 198W, and is partially transmitted downward. Light reciprocating in the cavity D1 between the upper transflective members 198R, 198G, 198B, 198W and the common electrode 270 is subject to an optical process such as interference before exiting the cavity through the upper transflective members 198R, 198G, 198B, 198W.

Light emitted from the lower organic light emitting member 380 toward the substrate 110 and light arriving through the upper transflective members 198R, 198G, 198B, 198W from the first cavity D1 passes through the pixel electrodes 191R, 191G, 191B, and 191W and arrives at the lower transflective members 194R, 194G, 194B, 194W. Some of this light is then reflected by the lower transflective members 194R, 194G, 194B, 194W toward the upper transflective members 198R, 198G, 198B, 198W, and then is either reflected again by the upper transflective members 198R, 198G, 198B, and 198W toward the lower transflective members 194R, 194G, 194B, 194W or is transmitted toward the common electrode 270. Light reciprocating in the second cavity D2 between the lower transflective members 194R, 194G, 194B, 194W and the upper transflective members 198R, 198G, 198B, 198W is also subject to an optical process such as interference before exiting through the lower transflective members 194R, 194G, 194B, 194W and the color filters 230R, 230G, 230B, 230W.

Light may reciprocate, through reflection, in the third cavity D3 between the lower transflective members 194R, 194G, 194B, and 194W and the common electrode 270, and is also subject to an optical process such as interference before exiting through the color filters 230R, 230G, 230B, 230W.

The organic light emitting device displays images by spatially combining primary colors transmitted by the color filters 230R, 230G, 230B, 230W.

The optical path lengths of the first (upper) cavity D1, the second (lower) cavity D2, and the third (combined) cavity D3 depend on the thicknesses of the thin films present in these cavities and on the refractive indexes thereof and may be set to intensify light of desired wavelengths through constructive interference to obtain high color purity if the thin films' materials and thicknesses are appropriately selected. It is desirable to explain how the optical path length is measured since it is different for different wavelengths. The following is an attempt to do so (explaining that the wavelength dependence is insignificant in the visible range). In this patent application, "wavelength" refers to the wavelength in air or vacuum unless indicated otherwise. Of note, the optical path length depends on the refractive index applicable for, and hence on the wavelength of light traveling through the optical path. However, the materials of the organic light emitting members 380, 390 and the reflectances of the transflective members can be selected so that the wavelength dependence of the optical path lengths is insignificant in the visible range. The term "optical path length" will therefore denote the optical path length for some predetermined wavelength in the visible range, e.g. for a monochromatic green or some other monochromatic color. In some embodiments, the optical path length of the second cavity D2 is selected to intensify light in the wavelength ranges of the red, green, and blue colors; and the optical path length of the upper cavity D1 is selected to intensify light in the wavelength range of at least one of the red, green, and blue colors, to increase the emission efficiency for such colors. For instance, two times the optical path length in the thickness direction (i.e. the vertical path length) of the lower cavity D2 may be an integer multiple of the wavelength of at least one of the red, green, and blue colors; and two times the optical path length in the thickness direction of the upper cavity D1 may be an integer multiple of the wavelength of some color C which is one the red, green and blue colors (which is the color intended to be intensified). Of note, in some embodiments, in each pixel, the upper organic light emitting member 390 emits only one color (e.g. only red, green, or blue), or only two colors (e.g. only red and blue).

The optical path length of the combined cavity D3 is approximately the sum of the optical path lengths of the upper cavity D1 and the lower cavity D2, and the optical path length of the combined cavity D3 may be set to an integer multiple of the predetermined wavelength which is to be enhanced (e.g. the wavelength of color C), thereby enhancing light of that wavelength or a wavelength region containing that wavelength.

In some embodiments, two or three colors are enhanced in the upper cavity D1. For example, the red and blue may be simultaneously enhanced. In this case, the optical path length of the first cavity D1 is set to a suitable value. The optical path length of the first and second cavities D1 and D2 may be selected in many ways to intensify light of wavelengths in a desired range and improve the reproducibility of the corresponding colors.

According to some embodiments described above, an organic light-emitting display device may include two organic light emitting members 380 and 390 one of which overlies the other. High emission is therefore obtained. Further, the upper transflective members 198R, 198G, 198B, and 198W are disposed between the two organic light emitting members 380 and 390 to obtain constructive interference of light reciprocating in the cavities D1 and D2 so as to increase the emission efficiency and the color purity and to improve the viewing angle compared with the case in which two organic emission layers are simply stacked one over the other.

Further, in some embodiments, the upper organic light emitting member 390 may be formed using an emission material emitting only one of the primary colors (e.g. one of red, green, and blue), or only two of the primary colors (e.g. only red and blue), to increase the luminance of only such colors.

Now the lower transflective members 194R, 194G, 194B, and 194W and the upper transflective members 198R, 198G, 198B, and 198W will be described in detail with reference to FIG. 3 and FIG. 4.

Referring to FIG. 3, the lower transflective members 194R, 194G, 194B, and 194W may be made of a three-layer structure 194a including a transflective metal member 193, a lower conductive oxide member 192b, and an upper conductive oxide member 192a. The lower and upper conductive oxide members 192b, 192a can be made of a metal oxide such as ITO or IZO.

The transflective metal member 193 may be made of a metal having high reflectance such as silver (Ag) or aluminum (Al), or alloys thereof, and may have a thickness in the range of about 20 Å-200 Å. Such metal layers are transflective if they are sufficiently thin.

The upper and lower conductive oxide members 192a and 192b are disposed respectively on and under the transflective metal member 193 to improve adhesion between the transflective metal member 193 and the overlying and underlying layers and to prevent corrosion. Particularly, the lower conductive oxide member 192b protects the transflective metal members 193 from oxygen or moisture emitted from the organic overcoat 180. The upper conductive oxide member 192a may be omitted.

Alternatively, referring to FIG. 4, the lower transflective members 194R, 194G, 194B, and 194W may have a multi-layer (e.g. two-layer) structure 194b including a lower layer 193b and an upper layer 193a. The lower layer 193b and the upper layer 193a may be made of materials having different refractive indexes. Suitable materials include silicon nitride (SiNx), silicon oxide (SiOx), and titanium oxide (TiO). The lower layer 193b may be made of one of these three materials, and the upper layer 193a may be made another one of these three materials. As another example, the lower layer 193b may be made of a conductive oxide such as ITO or IZO, and the upper layer 193a may be made of an inorganic material such as silicon nitride, silicon oxide, or titanium oxide, or vice versa. Also, the lower transflective members 194R, 194G, 194B, and 194W may be a multilayer structure of three or more layers, with adjacent layers having different refractive indexes. Suitable materials for such structures include inorganic materials such as silicon oxide, silicon nitride, titanium oxide, ITO, IZO, and other conductive oxides.

In the exemplary embodiment shown in FIG. 4, light incident from above is partially reflected and transmitted at the boundary between the lower layer 193b and the upper layer 193a due to the difference in the refractive indexes between the lower layer 193b and the upper layer 193a. Also, if the overcoat 180 has a refractive index different from the refractive index of the lower layer 193b, light incident from above may be partially reflected at the boundary between the overcoat 180 and the lower layer 193b.

The structures of FIG. 3 or 4 are not limiting, and the lower transflective members 194R, 194G, 194B, and 194W may be constructed in other ways to partially reflect and partially transmit incident light.

The structures described above for the lower transflective members 194R, 194G, 194B, and 194W are also suitable for the upper transflective members 198R, 198G, 198B, and 198W.

Figure 5:
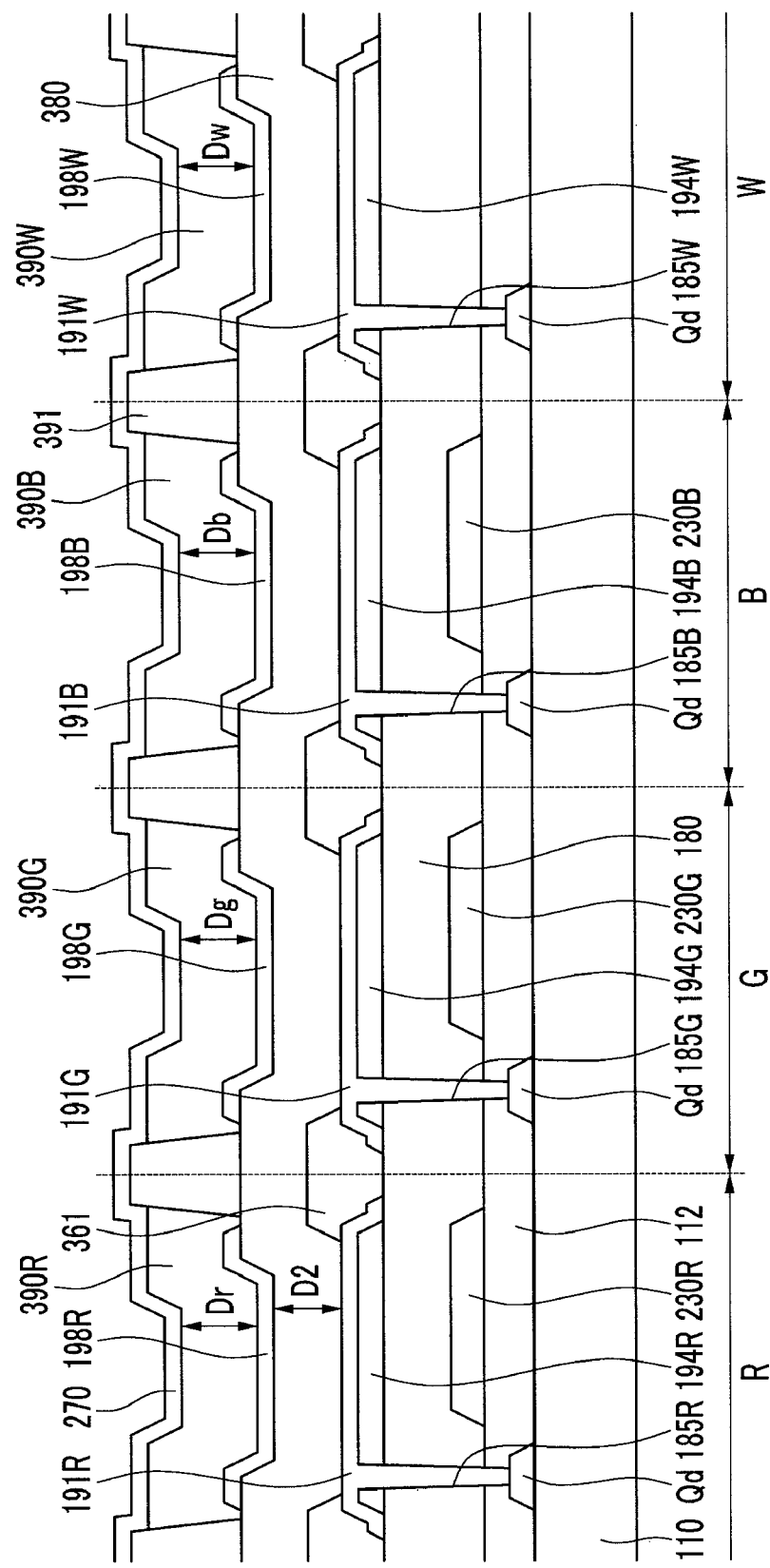
FIG. 5 to FIG. 8 are cross-sectional views of organic light emitting devices according to exemplary embodiments of the present invention.

FIG. 5 is a cross-sectional view of an organic light emitting device used in other exemplary embodiments of the present invention. Detailed description of the elements common with FIG. 2 will be omitted. Common elements are indicated by the same reference numerals.

A thin film transistor array, an insulating layer 112, color filters 230R, 230G, and 230B, an overcoat 180, lower transflective members 194R, 194G, 194B, and 194W, pixel electrodes 191R, 191G, 191B, and 191W, insulating members 361, a lower organic light emitting member 380, upper transflective members 198R, 198G, 198B, are 198W, partitions 391, red, green, blue and white organic light emitting members 390R, 390G, 390B, and 390W, and a common electrode 270 are sequentially formed on the insulation substrate 110. Of note, no color filter is used in the white pixels W.

Unlike the exemplary embodiment shown in FIG. 2, the embodiment of FIG. 5 includes partitions 391 disposed directly on the lower organic light emitting member 380 between the upper transflective members 198R, 198G, 198B, 198W. In top view (not shown), the partitions 391 form a continuous structure positioned between the pixel electrodes 191R, 191G, 191B, 191W, laterally surrounding each pixel electrode and separating the adjacent pixel electrodes from each other. The partitions structure 391 thus defines an opening over each pixel electrode. The partitions 391 may be made of an organic or inorganic insulator.

Red, green, blue and white organic light emitting members 390R, 390G, 390B, and 390W are disposed in the respective openings in the partitions structure 391 at the respective red, green, blue, and white pixels R, G, B, and W. Each of the red, green, and blue organic light emitting members 390R, 390G, and 390B may be made of an organic material or materials emitting only the corresponding one of the red, green, and blue colors. Alternatively, each of the red, green, and blue organic light emitting members 390R, 390G, and 390B may be made of an organic material or materials emitting two or three of the red, green and blue colors.

The thickness of the organic light emitting members 390R, 390G, 390B, 390W may be controlled such that the optical path lengths of the first cavities Dr, Dg, Db, Dw between the respective upper transflective members 198R, 198G, 198B, 198W and the common electrode 270 for the respective pixels R, G, B, W may have appropriate values.

The optical path length of the second cavity D2 may be selected to enhance light corresponding to the red, green, and blue wavelength regions through reflection and constructive interference. The optical path lengths of the first cavities Dr, Dg, and Db of the red, green, and blue pixels R, G, and B may be selected to enhance light corresponding respectively to the red, green, and blue wavelength regions through reflection and constructive interference. Thereby, the emission efficiency of each of the primary colors may be improved.

In particular, the first cavities Dr and Db of the red and blue pixels R and B may have the same thickness. Each first cavity Dw of the white pixel W may have a portion having the same thickness as the first cavities Dr and Db of the red and blue pixels R and B and another portion having the same thickness as the first cavity Dg of the green pixel G. The areas of the two portions can be chosen to cause the two portions, and hence the entire white pixel W, to emit white light.

In some embodiments, the partitions 391 are omitted.

Figure 6:
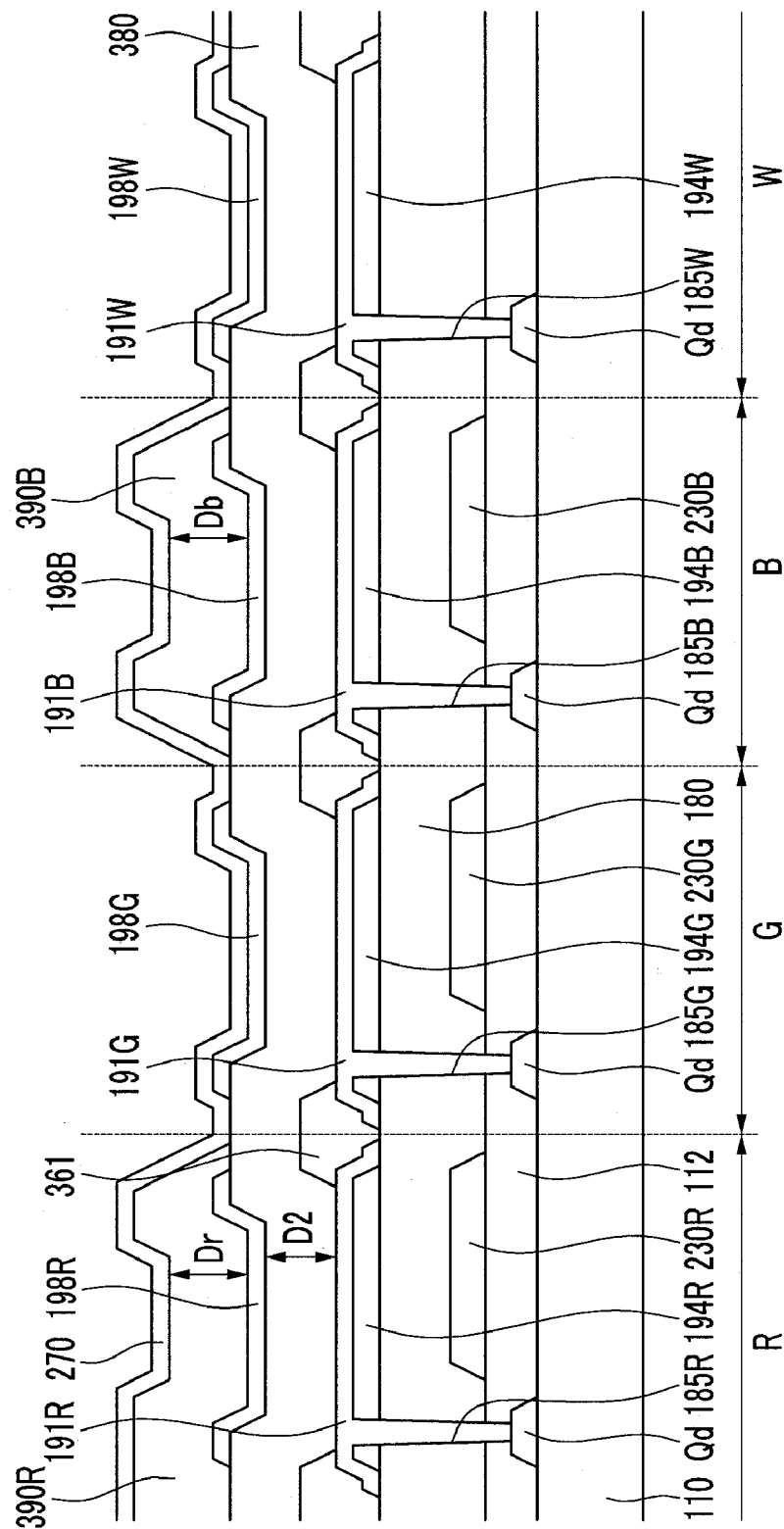

FIG. 6 is a cross-sectional view of an organic light emitting device according to another exemplary embodiment of the present invention. This embodiment is almost identical to the organic light emitting device shown in FIG. 5. The description of features common with the embodiment of FIG. 5 will be omitted. The common features are indicated by the same reference numerals.

To manufacture the embodiment of FIG. 6, a thin film transistor array, an insulating layer 112, color filters 230R, 230G, and 230B, an overcoat 180, lower transflective members 194R, 194G, 194B, and 194W, pixel electrodes 191R, 191G, 191B, and 191W, insulating members 361, a lower organic light emitting member 380, upper transflective members 198R, 198G, 198B, and 198W, red and blue organic light emitting members 390R and 390B, and a common electrode 270 are sequentially formed, in that order, on an insulation substrate 110.

Unlike the embodiment of FIG. 5, the embodiment of FIG. 6 includes the upper organic light emitting members 390 (shown as 390R and 390B) only in the red and blue pixels. More particularly, the red and blue organic light emitting members 390R and 390B are disposed on the respective upper transflective members 198R and 198B of the red and blue pixels R and B but are not present in the green and white pixels G and W.

The optical path length of the second cavity D2 may be selected to intensify light in the red, green, and blue wavelength regions, and the optical path lengths of the first cavities Dr and Db of the red and blue pixels R and B may be selected to intensify light in the red and blue wavelength regions. Accordingly, color purity of the primary colors may be increased, and the emission efficiency of the red and blue light may be increased.

In some variations, the upper organic member 390 is provided for some chosen pair of primary colors other than red and blue, i.e. in the pixels corresponding to the chosen pair of primary colors but not in the remaining pixels, to enhance the primary colors of the chosen pair.

Some variations of the embodiment of FIG. 6 include an additional organic light emitting member (not shown) in each white pixel W on a portion of the respective upper transflective member 198W. These additional organic light emitting members have the same thickness as the first cavities Dr and Db of the red and blue pixels R and B. The widths of the additional organic light emitting members are chosen so that each pixel W emits white light.

The upper transflective members 198G and 198W of the green and white pixels G and W may be omitted.

Figure 7:
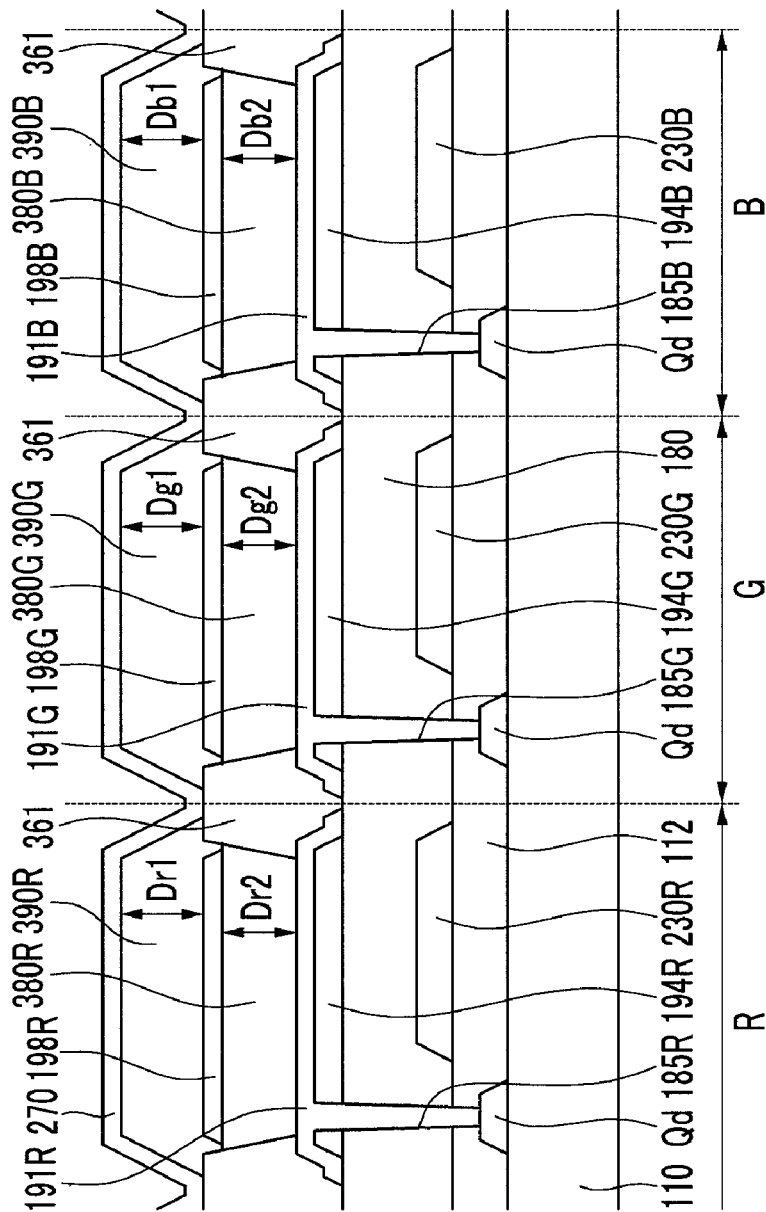

FIG. 7 is a cross-sectional view of an organic light emitting device according to another exemplary embodiment of the present invention. This embodiment is almost identical to the embodiment of FIG. 6. The description of the elements common with the embodiment of FIG. 6 will be omitted. The common elements are indicated by the same reference numerals.

A thin film transistor array, an insulating layer 112, color filters 230R, 230G, and 230B, an overcoat 180, lower transflective members 194R, 194G, and 194B, pixel electrodes 191R, 191G, and 191B, insulating members 361, lower red, green, and blue organic light emitting members 380R, 380G, and 380B, upper transflective members 198R, 198G, and 198B, upper red, green, and blue organic light emitting members 390R, 390G, and 390B, and a common electrode 270 are formed on an insulation substrate 110. The white pixels W are absent.

Also, in contrast with the embodiment shown in FIG. 6, the embodiment of FIG. 7 includes lower red, green, and blue organic light emitting members 380R, 380G, and 380B disposed in the openings between the insulating members 361 at the respective pixels R, G, and B, with the respective upper transflective members 198R, 198G, and 198B disposed thereon. The upper red, green, and blue organic light emitting members 390R, 390G, and 390B are respectively disposed on the upper transflective members 198R, 198G, and 198B of the pixels R, G, and B.

Organic light emitting members emitting light of suitable colors are formed in pairs at the respective corresponding pixels R, G, and B, with the upper transflective members 198R, 198G, and 198B disposed therebetween, such that light of a specific wavelength range may be enhanced and color purity and emission efficiency of the primary colors may be increased.

In some variations, the color filters 230R, 230G, and 230B are omitted.

Figure 8:
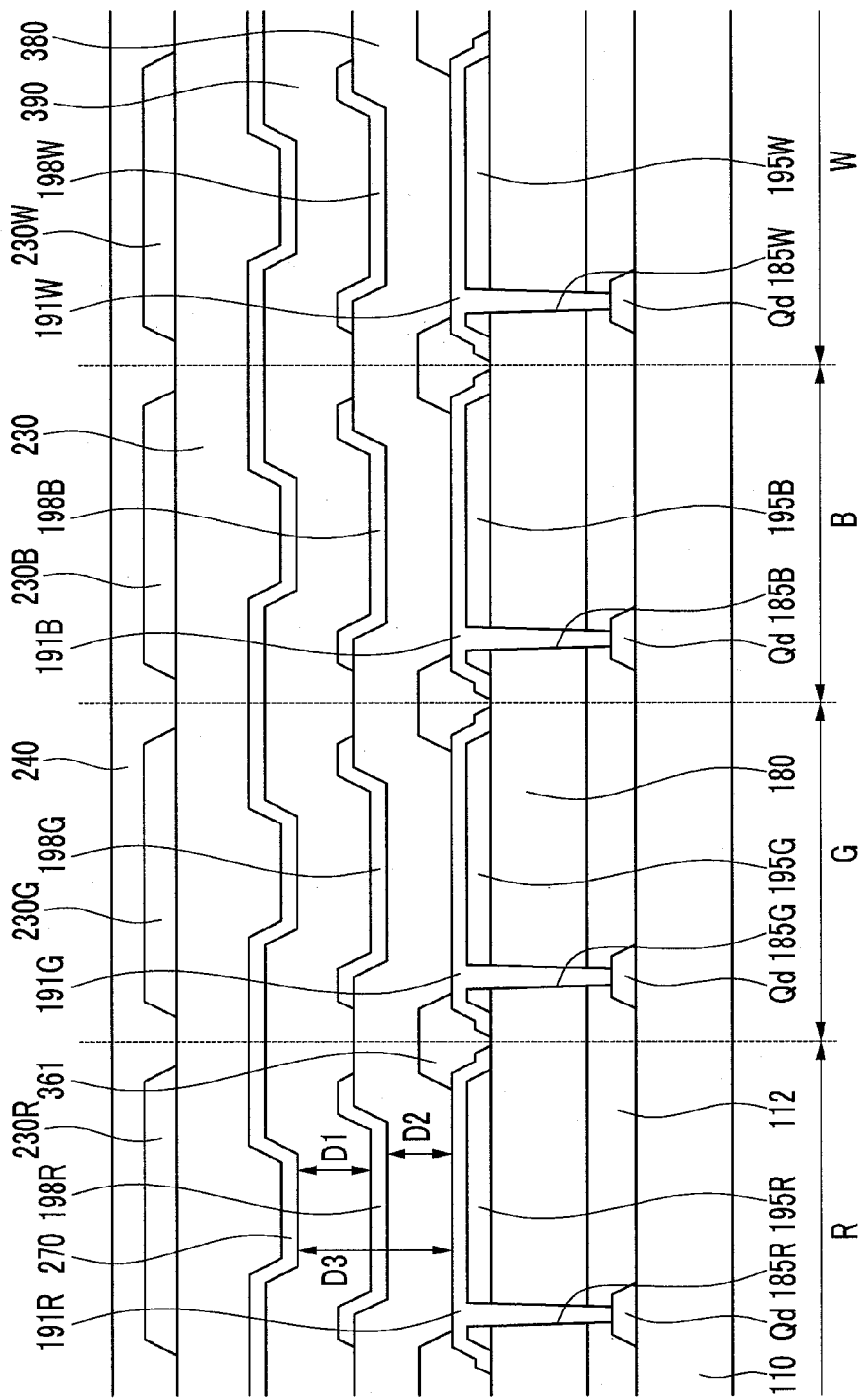

FIG. 8 is a cross-sectional view of an organic light emitting device according to another exemplary embodiment of the present invention. This embodiment is almost identical to the embodiment of FIG. 2, and the common elements of the two embodiments are indicated by the same reference numerals and will not be further described.

In the embodiment of FIG. 8, a thin film transistor array, an insulating layer 112, an overcoat 180, reflective members 195R, 195G, 195B, and 195W, pixel electrodes 191R, 191G, 191B, and 191W, insulation members 361, a lower organic light emitting member 380, upper transflective members 198R, 198G, 198B, and 198W, an upper organic light emitting member 390, a common electrode 270, a lower overcoat 230, color filters 230R, 230G, 230B, and 230W, and an upper overcoat 240 are formed, in that order, on an insulation substrate 110.

The reflective members 195R, 195G, 195B, and 195W each include a reflective metal member made of an opaque conductive material such as aluminum, an aluminum alloy, silver, or a silver alloy, and a metal having a high work function such as Au, Pt, Ni, Cu, W, or alloys thereof. The reflective members 195R, 195G, 195B, and 195W may further include a conductive oxide layer such as ITO or IZO disposed on and/or below the reflective metal member for improving the adhesion of the reflective metal member to an adjacent layer or layers.

The common electrode 270 may be made of a metal such as calcium (Ca), barium (Ba), aluminum (Al), magnesium (Mg), aluminum (Al), and silver (Ag), and is transflective.

In contrast with the organic light emitting device shown in FIG. 2, in the organic light emitting device of FIG. 8 the color filters 230R, 230G, 230B, and 230W are disposed over the common electrode 270. The lower and upper overcoats 230 and 240 may be made of a possibly organic insulating material.

The organic light emitting device display emits light in the upper direction (away from the substrate 110) to display images. Light emitted from the lower and upper organic light emitting members 380 and 390 reciprocates in the first cavity D1 between the upper transflective members 198R, 198G, 198B, and 198W and the common electrode 270, in the second cavity D2 between the reflective members 195R, 195G, 195B, and 195W and the upper transflective members 198R, 198G, 198B, and 198W, and in the third cavity D3 between the reflective members 195R, 195G, 195B, and 195W and the common electrode 270 and is subjected to an optical process such as constructive interference. Having been subjected to the constructive interference, the light exits through the color filters 230R, 230G, 230B, and 230W, with appropriate colors enhanced as described above for other embodiments.

The lower and upper organic light emitting members 380 and 390 operate as in the embodiment of FIG. 2.

The present disclosure of invention is not limited to the structures described above. The embodiments described above, and possibly other embodiments, provide improvements in the areas of color reproducibility, emission efficiency, and viewing angle. Such and other embodiments do not limit the invention.

What is claimed is:

1. An organic light emitting device structured to emit a plurality of lights of different predetermined wavelengths including two or more different primary color lights, the device comprising:
    a substrate;
    two or more first transflective members disposed on the substrate and within a first layer above the substrate;
    two or more pixel electrodes disposed within a second layer above the substrate and respectively over the respective two or more first transflective members;
    two or more first organic light emitting members disposed within a third layer above the substrate and respectively over the respective two or more pixel electrodes;
    two or more second transflective members disposed within a fourth layer above the substrate and respectively over the respective two or more first organic light emitting members;
    two or more second organic light emitting members disposed within a fifth layer above the substrate and respectively over the respective second transflective members; and
    a reflective common electrode disposed on the two or more second organic light emitting members,
    wherein at least a first resonant optical cavity having a respective first optical path length for a first predetermined wavelength of to be emitted light is defined by the reflective common electrode, by a one of the second organic light emitting members and by an underlying one of the second transflective members; and
    wherein at least a second resonant optical cavity having a respective second optical path length for a second predetermined wavelength of to be emitted light is defined by said underlying one of the second transflective members, by an underlying one of the first organic light emitting members and by an underlying one of the first transflective members, and
    wherein at least one of the first and second resonant optical cavities is an intensity and color purity enhancing cavity for the first predetermined wavelength of to be emitted light.

2. The organic light emitting device of claim 1, wherein within the fifth layer, at least one organic light emitting member is a white light emitting member and another organic light emitting member is not a white light emitting member.

3. The organic light emitting device of claim 1, wherein two times a vertical optical path length between a respective one of the second transflective members and the common electrode is an integer multiple of one among respective wavelengths of light of a first primary color, a second primary color, and a third primary color.

4. The organic light emitting device of claim 3, wherein two times a vertical optical path length between a respective one of the first transflective members and the common electrode is an integer multiple of one among respective wavelengths of light of the first primary color, the second primary color, and the third primary color.

5. The organic light emitting device of claim 3, wherein two times a vertical optical path length between a respective one of the second transflective members and a respective one of the first transflective members is an integer multiple of one among respective wavelengths of light of the first primary color, the second primary color, and the third primary color.

6. The organic light emitting device of claim 5, further comprising a first color filter for selectively transmitting the first color, a second color filter for selectively transmitting the second color, and a third color filter for selectively transmitting the third color, wherein the first, second and third color filters are disposed on the substrate.

7. The organic light emitting device of claim 6, wherein respective second organic light emitting member within the fifth layer is at least one of a first color organic light emitting member emitting the first color, a second color organic light emitting member emitting the second color, and a third color organic light emitting member emitting the third color.

8. The organic light emitting device of claim 6, wherein the two or more second organic light emitting members comprise:
    a first color organic light emitting member which is for emitting the first color and which is disposed over the first color filter;
    a second color organic light emitting member which is for emitting the second color and which is disposed over the second color filter; and
    a third color organic light emitting member which is for emitting the third color and which is disposed over the third color filter.

9. The organic light emitting device of claim 8, wherein the one or more second organic light emitting members further comprise a white organic light emitting member neighboring at least one of the first color organic light emitting member, the second color organic light emitting member, and the third color organic light emitting member.

10. The organic light emitting device of claim 8, further comprising a partition between the first color organic light emitting member, the second color organic light emitting member, and the third color organic light emitting member.

11. The organic light emitting device of claim 1, wherein the two or more first organic light emitting members comprise a first color organic light emitting member for emitting a first color, a second color organic light emitting member for emitting a second color different from the first color, and a third color organic light emitting member for emitting a third color different from the first and second colors.

12. The organic light emitting device of claim 11, wherein the two or more second organic light emitting members comprise a fourth color organic light emitting member for emitting a fourth color, a fifth color organic light emitting member for emitting a fifth color different from the fourth color, and a sixth color organic light emitting member for emitting a sixth color different from the fourth and fifth colors.

13. The organic light emitting device of claim 12, wherein
the first color organic light emitting member and the fourth color organic light emitting member overlap each other,
the second color organic light emitting member and the fifth color organic light emitting member overlap each other,
the third color organic light emitting member and the sixth color organic light emitting member overlap each other,
the first color is identical to the fourth color,
the second color is identical to the fifth color, and
the third color is identical to the sixth color.

14. The organic light emitting device of claim 1,
wherein the two or more first organic light emitting members comprise at least one of a first color organic light emitting member for emitting a first color, a second color organic light emitting member for emitting a second color, and a third color organic light emitting member for emitting a third color, and
the two or more second organic light emitting members comprise at least one of the first color organic light emitting member, the second color organic light emitting member and the third color organic light emitting member.

15. The organic light emitting device of claim 1, wherein the first and second transflective members comprise a transflective metal member comprising silver (Ag) or aluminum (Al).

16. The organic light emitting device of claim 15, wherein a thickness of the transflective metal member is in the range of 20 Å to 200 Å.

17. The organic light emitting device of claim 15, wherein at least one of the first and second transflective members comprises the transflective metal member in combination with a conductive oxide member disposed on or under the transflective metal member.

18. The organic light emitting device of claim 17, wherein the conductive oxide member comprises ITO or IZO.

19. The organic light emitting device of claim 1, wherein at least one of the first and second transflective members comprises a first thin film and a second thin film whose refractive indexes are different from each other.

20. The organic light emitting device of claim 19, wherein the first thin film comprises one of silicon oxide, silicon nitride, and titanium oxide, and the second thin film comprise another one of silicon oxide, silicon nitride, and titanium oxide.

21. The organic light emitting device of claim 19, wherein the first thin film comprises ITO or IZO, and the second thin film comprises at least one of silicon oxide, silicon nitride, and titanium oxide.

22. The organic light emitting device of claim 1, wherein at least one of the first transflective members comprises a transflective metal member comprising silver or aluminum, and at least one of the second transflective members comprises a first thin film and a second thin film whose refractive indexes are different from each other.

23. The organic light emitting device of claim 1, wherein at least one of the first transflective members comprises a first thin film and a second thin film whose refractive indexes are different from each other, and at least one second transflective members comprises a transflective metal member comprising silver or aluminum.

24. An organic light emitting device comprising a first pixel structured to selectively output a first color, a second pixel structured to selectively output a different second color, and a third pixel structured to selectively output a different third color,
wherein each of the first, second, and third pixels respectively comprises:
a respective first transflective member;
a respective pixel electrode disposed over the respective first transflective member;
a respective first organic light emitting member disposed over the respective pixel electrode;
a respective second transflective member disposed over the respective first organic light emitting member;
a respective second organic light emitting member disposed over the respective second transflective member; and
a reflective common electrode disposed over the second organic light emitting member, wherein
the respective second transflective members of the first, second, and third pixels are spaced from each other.

25. A method for manufacturing the organic light emitting device of claim 24, the method comprising forming the second transflective members of the first, second, and third pixels by using a shadow mask.

26. An organic light emitting device comprising a first pixel structured to selectively output a first color, a second pixel structured to selectively output a different second color, and a third pixel structured to selectively output a different third color,
wherein each of the first, second, and third pixels respectively comprises:
a respective reflective electrode part;
a respective first organic light emitting member disposed over the respective reflective electrode part;
a respective transflective member disposed over the respective first organic light emitting member;
a respective second organic light emitting member disposed over the respective transflective member; and
a respective pixel electrode disposed over the respective second organic light emitting member and being at least partially transmissive to light,
wherein the respective transflective members of the first, second, and third pixels are spaced apart from each other.

27. The organic light emitting device of claim 26, further comprising for each respective pixel:
a respective color filter disposed over the respective pixel electrode.

* * * * *